United States Patent [19]

Tuttle et al.

[11] Patent Number: 5,700,981
[45] Date of Patent: Dec. 23, 1997

[54] ENCAPSULATED ELECTRONIC COMPONENT AND METHOD FOR ENCAPSULATING AN ELECTRONIC COMPONENT

[75] Inventors: Mark E. Tuttle; Joseph P. Mousseau; Clay L. Cirino, all of Boise, Id.

[73] Assignee: Micron Communications, Inc., Boise, Id.

[21] Appl. No.: 598,461

[22] Filed: Feb. 8, 1996

[51] Int. Cl.$^6$ ....................................... H05K 1/00
[52] U.S. Cl. ................. 174/250; 174/52.2; 361/765; 29/841; 257/787
[58] Field of Search ........................ 174/250, 255, 174/256, 258, 260, 52.2, 52.3, 52.4; 361/760, 761, 762, 764, 765, 812; 29/855, 856, 841, 885; 257/782, 783, 784, 787

[56] References Cited

U.S. PATENT DOCUMENTS

| | | | |
|---|---|---|---|
| 4,122,211 | 10/1978 | Kikuga et al. | 427/461 |
| 5,422,514 | 6/1995 | Griswold et al. | 257/787 X |
| 5,528,457 | 6/1996 | Hawke et al. | 361/706 |
| 5,547,730 | 8/1996 | Weiblen et al. | 428/76 |
| 5,600,181 | 2/1997 | Scott et al. | 257/787 X |

OTHER PUBLICATIONS

IBM Technical Disclosures, vol. 11, No. 8, Cameron and Finch, p. 971, Jan. 1969.

Primary Examiner—Kristine L. Kincaid
Assistant Examiner—Kamano Cuneo

[57] ABSTRACT

A method for encapsulating an electronic component includes providing a substrate; providing an enclosure dam around at least a portion of electronic component placed relative to the substrate; providing a first substantially uncured flowable encapsulation material outwardly of the electronic component and within the enclosure dam; providing a second encapsulation material atop the first encapsulation material and within the enclosure dam; and curing the first encapsulation material into a substantially non-flowable state, the second encapsulation material and the enclosure dam retaining the first flowable encapsulation material relative to the electronic component and substrate during the curing, the cured first material and the second material collectively forming a resultant encapsulation body on the electronic component. An encapsulated body having the above attributes is also disclosed.

32 Claims, 3 Drawing Sheets

ENCAPSULATED ELECTRONIC COMPONENT AND METHOD FOR ENCAPSULATING AN ELECTRONIC COMPONENT

TECHNICAL FIELD

This invention relates to the formation of an encapsulated electronic component and a method for encapsulating an electronic component.

BACKGROUND OF THE INVENTION

In wafer fabrication, the wafers pass many times in and out of four basic operations. Such are layering, patterning, doping, and heat processing. In final packaging of dies cut from wafers, there are also several basic operations. As in fabrication, the exact order of the operation is determined by the package type and other factors. However, in packaging the flow is linear, with the semiconductor dies proceeding from one operation to the next, only going through the individual packaging operations once. As a general matter, the packaging operations for semiconductor devices include backside preparation, die separation, die pick, inspection, die attach, wire bonding, pre-seal inspection, package sealing, plating, trim, marking, and final test.

There are four basic functions performed by a semiconductor package. They are to provide a lead system, physical protection, environmental protection, and heat dissipation. In this regard, the primary function of the package is to allow connection of the chip or semiconductor device to a circuit board or directly to an electronic product. The second function of the package is the physical protection of the semiconductor device from breakage, contamination and abuse. Physical protection needs vary from low, as in the case of consumer products, to very stringent, as is the case for electronic circuits used in automobiles, space vehicles, and military applications. Environmental protection, on the other hand, for semiconductor devices is to protect the semiconductor device from chemicals, moisture and gases that may interfere with its functioning. Still further, every semiconductor device generates heat during operation. The package enclosure materials used with semiconductor devices serve in nearly all instances, to draw the heat away from the enclosed semiconductor devices thereby dissipating same.

One method of providing an enclosure includes the use of a two part epoxy system. Such is typically very slow to cure, with the epoxy remaining in a flowable state while it cures. Curing times for such epoxy materials may take 24 hours or more. Due in part to the flowable nature of the epoxy, such packaging requires that the semiconductor devices be maintained in a precisely level state for a significant period of time as the epoxy cures. This requirement, of course, reduces the throughput of this packaging method and is therefore very costly, and not conducive to high volume production.

A novel packaging method which addresses the shortcomings identified above, is the subject of the present invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the present invention, a method of encapsulating an electronic component includes the following steps:

providing a substrate;

providing an enclosure dam around at least a portion of an electronic component placed relative to the substrate;

providing a first substantially uncured flowable encapsulation material outwardly of the electronic component and within the enclosure dam;

providing a second encapsulation material atop the first encapsulation material and within the enclosure dam; and curing the first encapsulation material into a substantially non-flowable state, the second encapsulation material and enclosure dam retaining the first flowable encapsulation material relative to the electronic component and substrate during the curing, the cured first material and the second material collectively forming a resultant encapsulation body on the electronic component.

Another aspect of the present invention is to provide a method for encapsulating an electronic component which includes the following steps:

providing an enclosure dam around at least a portion of the electronic component, the electronic component supported relative to a substrate;

providing a first, flowable two part epoxy atop the electronic component and within the enclosure dam the first flowable two part epoxy being curable to a non-flowable state; and providing a second two part epoxy atop the first two part epoxy and within the enclosure dam, the second two part epoxy and the enclosure dam retaining the first flowable two part epoxy relative to the electronic component and substrate during the curing of the first two part epoxy, the cured first two part epoxy and the second two part epoxy collectively forming a resulting encapsulation body on the electronic component.

Still another aspect of the present invention relates to a composite encapsulation body for enclosing an electronic element relative to a substrate and which includes:

a first layer of material positioned in covering relation relative to the electronic element; the first layer having an uncured flowable state, and a cured non-flowable state; and a second layer of material positioned in covering relation relative to the first layer, the second layer facilitating retention of the first layer on the electronic element while the first layer remains in the uncured, flowable state.

Figure 1:
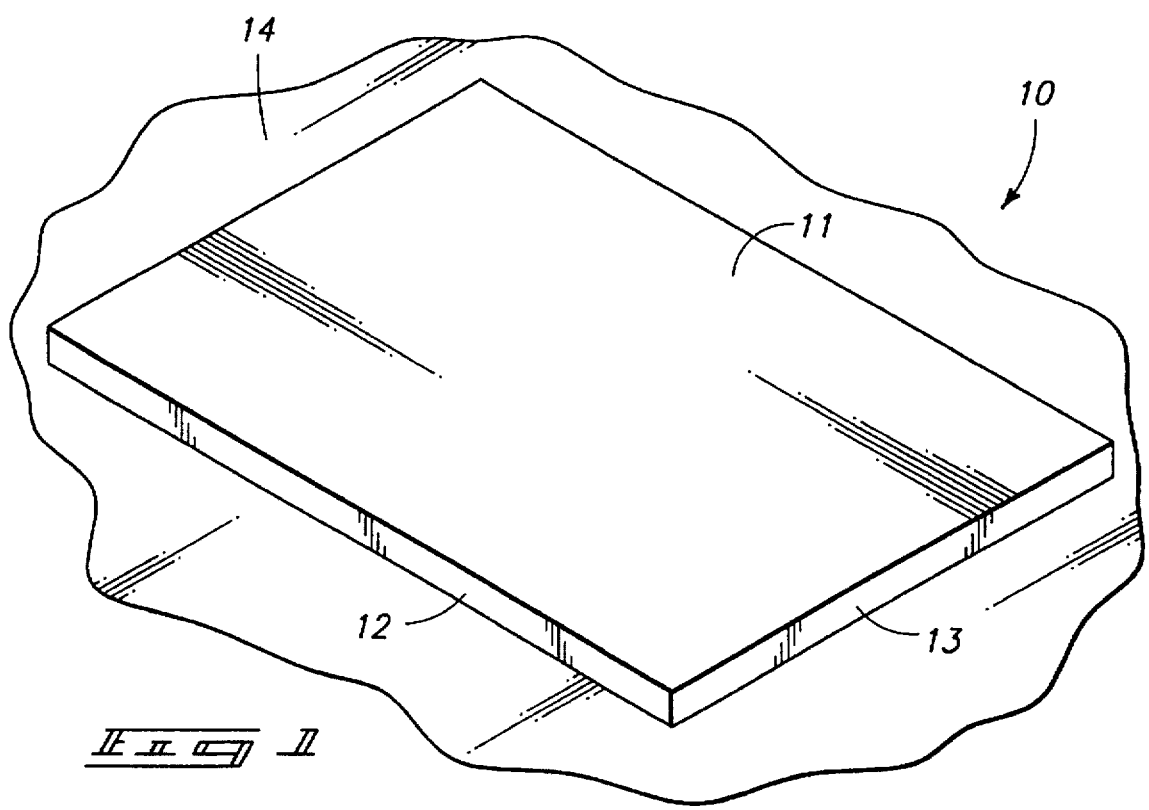
FIG. 1 is a perspective view of one processing step in accordance with the present invention.

Referring now to FIG. 1, a rigid substrate 10 is provided and which has a substantially level top or upwardly facing surface 11 and a downwardly facing surface 12. The substrate 10 is further defined by a peripheral edge 13. The downwardly facing surface 12 is supported on a fixturing table 14. The fixturing table 14 is very flat (within three mils) over the entire surface area thereof and substantially level.

Figure 2:
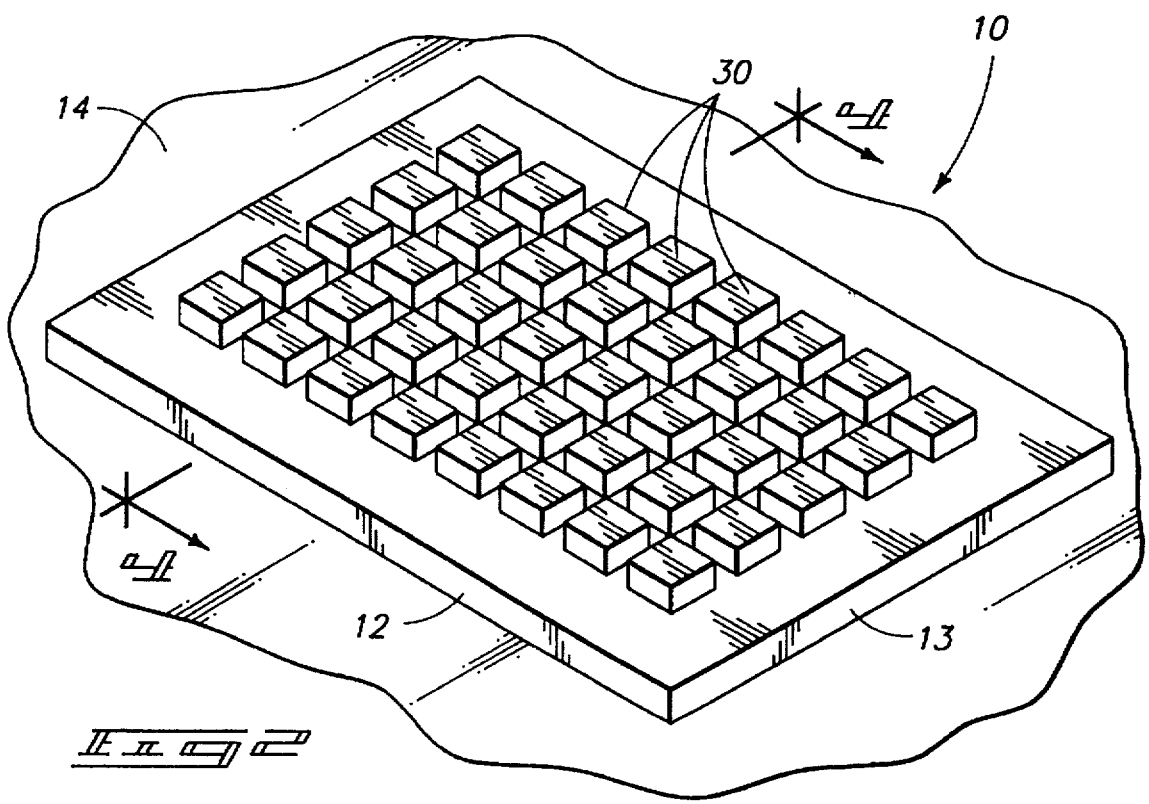
FIG. 2 is a perspective view of a processing step subsequent to that shown by FIG. 1.

As seen in FIG. 2, a plurality of electronic components 30 are placed in rested relation relative to the substrate 10. The individual electronic components are adhesively secured on the upwardly facing surface 11. The electronic components may be all manner of integrated circuitry components, such as dies or dies made integral with an associated printed circuit board. In the alternative, the dies or electronic components 30 may be placed in rested relation on the substrate 10 and, the dam 20 then laced around the electronic components.

Figure 3:
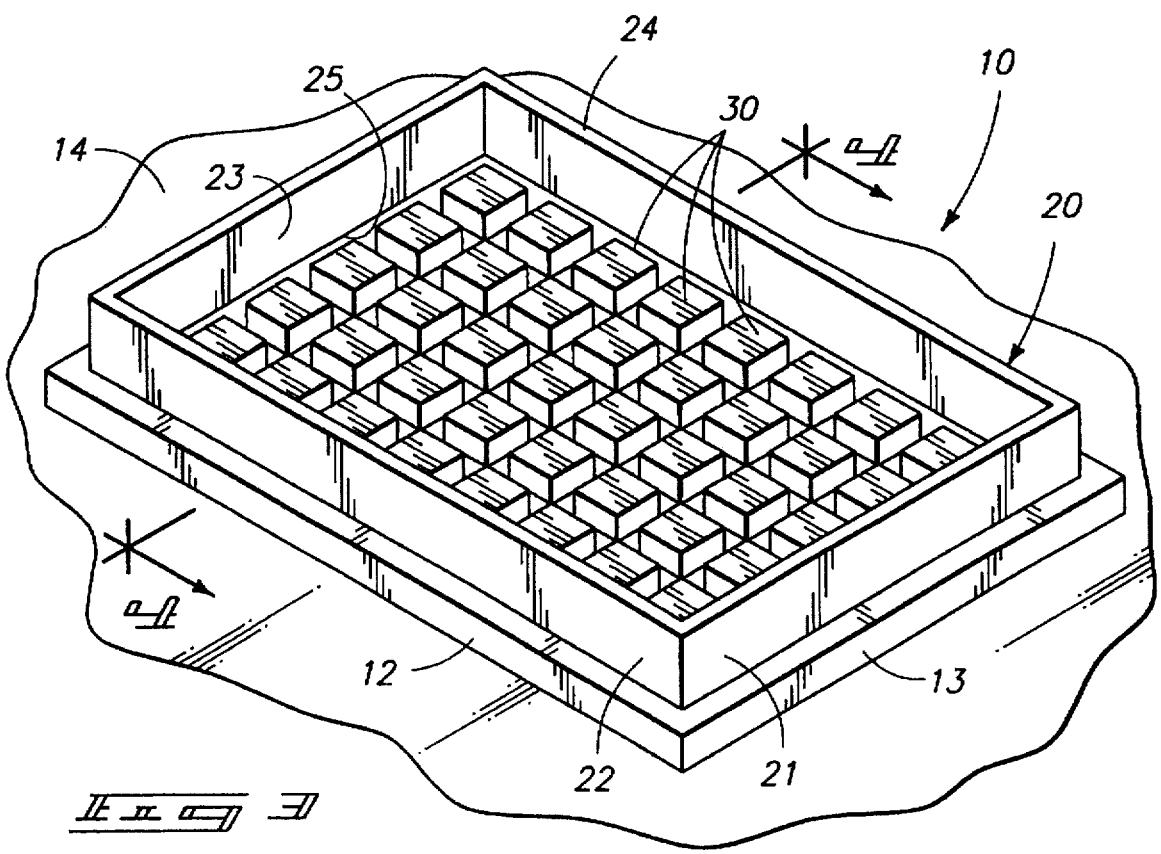
FIG. 3 is a perspective view of a processing step subsequent to that shown by FIG. 2.

FIG. 3 shows the method for encapsulating an electronic component at a step subsequent to that shown in FIG. 1. In FIG. 3, an enclosure dam 20 is shown atop the substrate 10, and in rested relation on the upwardly facing surface 11 thereof. The dam 20 may operate as a permanent or sacrificial (mechanical) structure. The dam 20 has a substantially continuous side wall 21 which is defined by an exterior facing surface 22, an interior facing surface 23, a top edge 24, and a bottom edge 25 which rests in juxtaposed relation on the upwardly facing surface 11. The continuous side wall 21 has a given height dimension, with an example being about 250 mils. In addition, it should be understood that while the dam 20 is shown as surrounding or encircling all of the electronic components 30, a dam 20 may be provided which surrounds only a portion of the electronic components 30. As noted above, the enclosure dam 20 has a given height dimension; and as seen in FIG. 3, this height dimension is greater than the height dimension of the individual electronic components 30.

Figure 4:
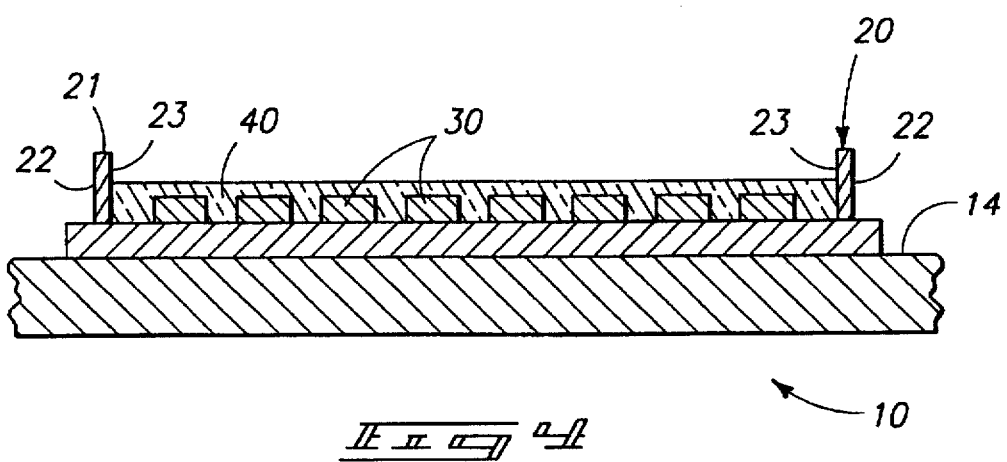
FIG. 4 is a transverse, vertical, sectional view taken from a position along line 4—4 of FIG. 3, and at a processing step subsequent to that shown in FIG. 3.

In FIG. 4, a first substantially uncured flowable encapsulation material 40 is provided outwardly of the electronic components 30, and within the enclosure dam 20. The first encapsulation material 40 comprises a slow curing high strength, and low shrinkage polymeric based material such as a thermosetting resin in the nature of a two part epoxy system. Two part epoxy resins are thermos erring resins based on the reactivity of the epoxide group. One type of epoxy is made from the reaction of epichlorohydrin and bisphenol A in the formulation of these types of epoxy. Aliphatic polyols such as glycerol may be used instead of the aromatic bisphenol A. Molecules of this type typically have glycidyl ether structures in the terminal positions, and further have many hydroxyl groups. These epoxies cure readily when exposed to amines.

Another type of epoxy resin is made from the reaction of polyolefins oxidized with peracetic acid. These substances have more epoxide groups, within the molecule as well as in the terminal positions and can be cured with anhydrides. Curing requires higher temperatures, however. Many modifications of both types are made commercially. As a general matter, the reactive epoxies form a tight cross-linked polymer network and are characterized by toughness, good adhesion, corrosive-chemical resistance, and good dielectric properties. Still further and as noted above, most epoxy resins are of the two-part type which harden or otherwise cure when blended. A two part epoxy material may be purchased from Epic Resins of Palmyra, Wis.

Figure 5:
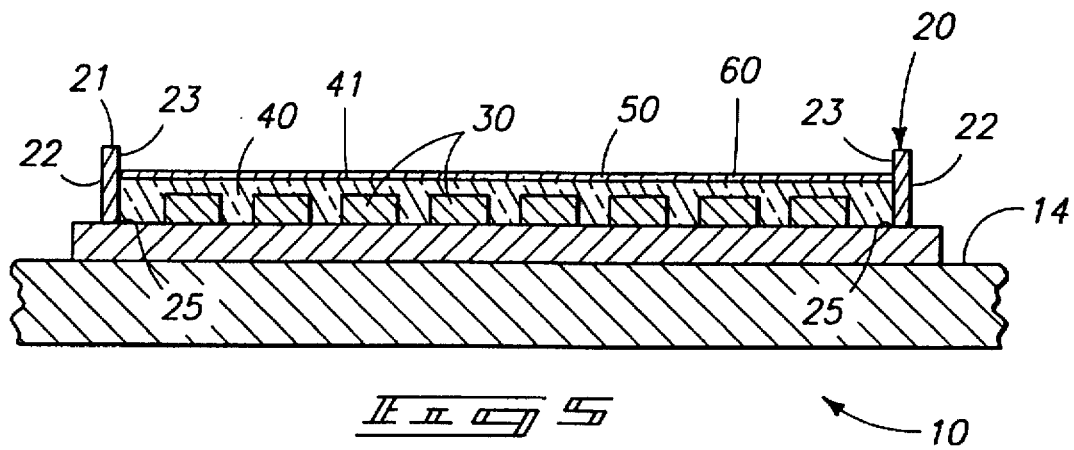
FIG. 5 is a transverse, vertical, sectional view taken from a position along line 4—4 of FIG. 3, and at a processing step subsequent to that shown in FIG. 4.

Referring now to FIG. 5, a second encapsulation material 50 is provided atop the first encapsulation material 40, and within the enclosure dam 20. The second encapsulation material 50 comprises a composition which, on occasion, is similar in chemistry to that of the first encapsulation material 40, but which has a given curing rate which is faster, relatively speaking, than the curing rate of the first encapsulation material 40. This second layer of encapsulating material 50, once substantially cured, effectively functions to hold or maintain the underlying slow curing first encapsulation material 40 relative to the electronic component 30 which is being coated. Once the second encapsulation material substantially cures, the substrate 10 can be moved from the fixturing table 14 to an environment that is not perfectly flat and level. This increases the throughput for production of such encapsulated electronic components 30 because the fixturing tables 14 are then made available for other devices to be packaged.

Figure 6:
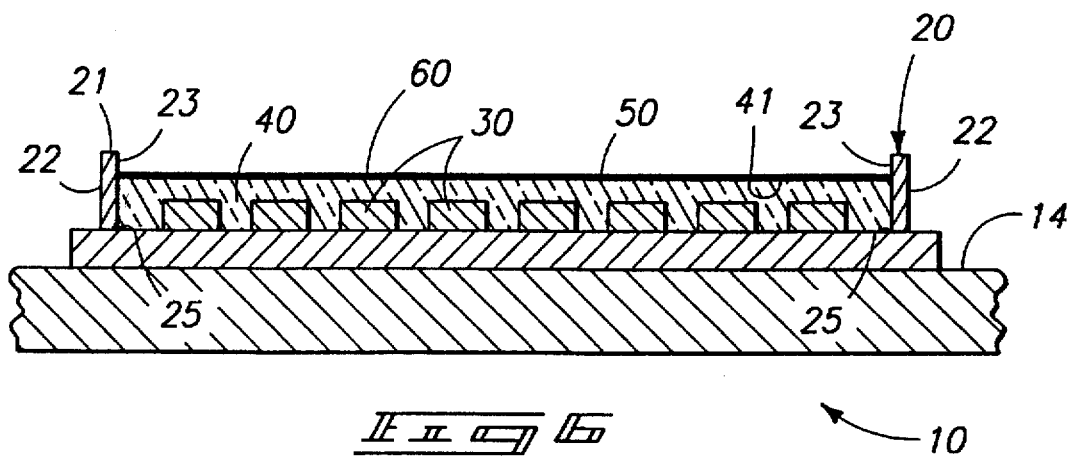
FIG. 6 is a transverse, vertical, sectional view taken from a position along line 4—4 of FIG. 3 and at an alternative processing step subsequent to that shown in FIG. 4.
Figure 7:
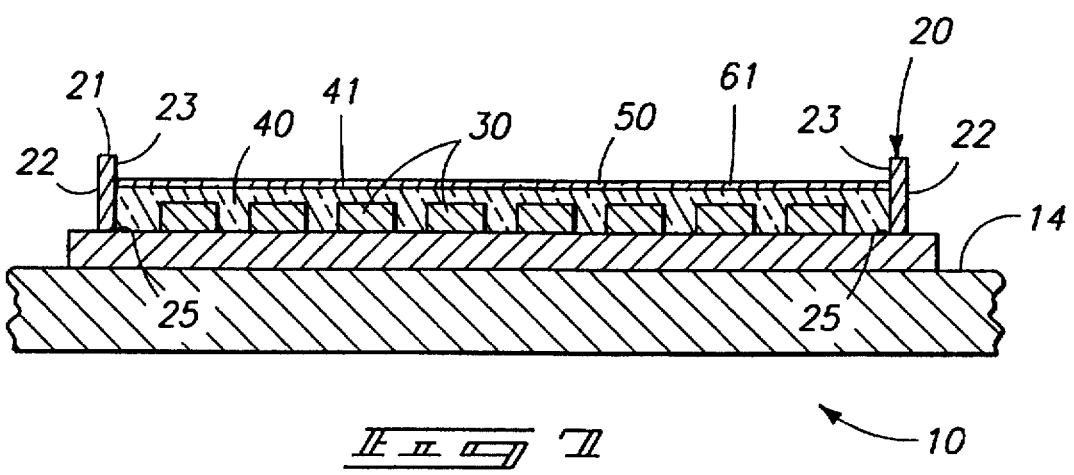
FIG. 7 is a transverse, vertical, sectional view taken from a position along 4—4 of FIG. 3 and at a processing step subsequent to that shown in FIG. 6.

An alternate form of the present invention is shown in FIG. 6. In the alternate form, electronic components 30 are provided atop the substrate 10, and a first encapsulation material 40 is provided atop the electronic components and within the dam 20. A catalyst 60 is then provided atop the exterior facing surface 41 of the first encapsulating material 40. The catalyst 60 effectively reacts, and becomes intermixed with the exterior facing surface 41. The catalyst 60 is effective in hardening or otherwise accelerating the curing rate of the exterior facing surface 41 to provide a shell 61 which operates as the second encapsulation material. The first encapsulation material 40 will cure into a hardened, non-flowable state following the passage of approximately 24 to 48 hours.

In still another alternative form of the invention, the second encapsulation material 50 of the first described embodiment may include a light curable coating which cures when exposed to certain radiation, such as ultraviolet radiation. In this particular form of the invention, the step of curing comprises exposing the light curable coating to ultraviolet radiation to cure the coating thereby providing the means for maintaining the first encapsulation material 40 contained over the individual electronic components 30. In all forms of the invention the dam 20 may, on the one hand, following curing, be removed, or on the other hand, become integral with the electronic components 30 being packaged. The method of the present invention provides a composite encapsulation body for enclosing the electronic component in a fashion not possible heretofore.

In compliance with the statute, the invention has been described in language more or less specific as to structural and methodical features. It is to be understood, however, that the invention is not limited to the specific features described since the means herein disclosed comprise preferred forms of putting the invention into effect. The invention is, therefore, claimed in any of its forms or modifications within the proper scope of the appended claims appropriately interpreted in accordance with the Doctrine of Equivalents.

We claim:

1. A method for encapsulating an electronic component comprising:

providing a substrate;

providing an enclosure dam around at least a portion of an electronic component placed on the substrate;

providing a first substantially uncured, flowable encapsulation material outwardly of the electronic component and within the enclosure dam;

providing a second encapsulation material atop the first encapsulation material and, within the enclosure dam; and curing the first encapsulation material into a substantially non-flowable state, the second encapsulation material and the enclosure dam retaining the first flowable encapsulation material relative to the electronic component and substrate during the curing, the cured first material and the second material collectively forming a resultant encapsulation body on the electronic component;

wherein the first encapsulation material has a first curing rate, and the second encapsulation material has a second curing rate, the second curing rate being faster than the first curing rate.

2. A method as claimed in claim 1, wherein a plurality of electronic components are placed on the substrate, and the enclosure dam encircles all of the electronic components.

3. A method as claimed in claim 1, wherein the electronic component has a given height dimension, and the enclosure dam has a height dimension greater than the height dimension of the electronic component.

4. A method as claimed in claim 1, wherein the enclosure dam is made integral with the encapsulation body.

5. A method as claimed in claim 1, wherein after the step of curing the first encapsulation material, removing the enclosure dam.

6. A method as claimed in claim 1, wherein the first encapsulation material is a two part epoxy.

7. A method as claimed in claim 1, wherein the second encapsulation material is a fast curing epoxy.

8. A method as claimed in claim 1, wherein the second material is a fast curing two part epoxy.

9. A method as claimed in claim 1, wherein the first encapsulation material has said first curing rate, and the second encapsulation material is a two part epoxy which has said second curing rate which is faster than the curing rate of the first encapsulation material.

10. A method as claimed in claim 1, wherein the first encapsulating material has an exterior facing surface, and the second encapsulation material accelerates the hardening of the exterior facing surface of the first encapsulation material.

11. A method as claimed in claim 1, wherein the first encapsulation material has an exterior facing surface, and wherein the method further comprises applying a catalyst to the exterior facing surface, the catalyst being effective to cause hardening of the exterior facing surface to provide the second encapsulation material.

12. A method as claimed in claim 1, wherein the second encapsulation material is a light curable coating, and the method further comprising providing light of a given wavelength to cure the light curable coating.

13. A method as claimed in claim 12, wherein the light curable coating cures when exposed to ultraviolet light, and the step of providing light comprises exposing the second encapsulation material to ultraviolet radiation.

14. An encapsulated electronic component manufactured in accordance with claim 1.

15. A method for encapsulating an electronic component, comprising:
providing an enclosure dam around at least a portion of the electronic component, the electronic component supported on a substrate;
providing a first, flowable two part epoxy atop the electronic component and within the enclosure dam, the first flowable two part epoxy being curable to a non-flowable state; and
providing a second two part epoxy atop the first two part epoxy and within the enclosure dam, the second epoxy and the enclosure dam retaining the first flowable two part epoxy relative to the electronic component and substrate during the curing of the first two part epoxy, the cured first two part epoxy and the second two part epoxy collectively forming a resulting encapsulation body on the electronic component.

16. A method as claimed in claim 15, wherein the first two part epoxy has a first curing rate, and the second curing has a second curing rate, the second curing rate being faster than the first curing rate.

17. A method as claimed in claim 15, wherein the first two part epoxy has an exterior facing surface, and wherein the method further comprises applying the second two part epoxy on the exterior facing surface, the second two part epoxy hardening over the exterior facing surface of the first two part epoxy.

18. A method as claimed in claim 15, wherein the first two part epoxy has an exterior facing surface, and wherein the method further comprises applying a catalyst to the exterior facing surface, the catalyst effective to accelerate the hardening of the exterior facing surface thereof.

19. A method as claimed in claim 15, wherein the enclosure dam is made integral with the encapsulation body.

20. A method as claimed in claim 15, wherein after curing, the enclosure dam is removed.

21. An encapsulated electronic component manufactured in accordance with claim 15.

22. A composite encapsulation body for enclosing an electronic element which rests on a substrate, comprising:
a first layer of material positioned in covering relation relative to the electronic element; the first layer having an uncured, flowable state, and a cured, non-flowable state; and
second layer of material positioned in covering relation relative to the first layer, the second layer facilitating retention of the first layer on the electronic element while the first layer is in the uncured, flowable state;
wherein the first layer comprises a slow curing two part epoxy and the second layer is a fast curing two part epoxy.

23. A composite encapsulation body as claimed in claim 22, wherein the first layer comprises said slow curing two part epoxy, and the second layer is a light curable coating.

24. A composite encapsulation body for enclosing an electronic element which rests on a substrate, comprising:
a first layer of material positioned in covering relation relative to the electronic element; the first layer having an uncured, flowable state, and a cured, non-flowable state; and
second layer of material positioned in covering relation relative to the first layer, the second layer facilitating retention of the first layer on the electronic element while the first layer is in the uncured, flowable state;
wherein the first layer comprises a slow curing two part epoxy which has an exterior facing surface, and the second layer comprises a material which accelerates the hardening of the exterior facing surface of the first layer two part epoxy to form the second layer.

25. A composite encapsulation body for enclosing an electronic element which rests on a substrate, comprising:
a first layer of material positioned in covering relation relative to the electronic element; the first layer having an uncured, flowable state, and a cured, non-flowable state; and
second layer of material positioned in covering relation relative to the first layer, the second layer facilitating retention of the first layer on the electronic element while the first layer is in the uncured, flowable state;

wherein the first layer comprises a slow curing two part epoxy which has an exterior facing surface, and a catalyst is applied to the exterior facing surface, the catalyst effective to harden the exterior facing surface and form the second layer of material.

26. A composite encapsulation body as claimed in claim 22, wherein first layer has a given curing rate, and the second layer has a curing rate which is faster than the curing rate of the first layer.

27. A composite encapsulation body as claimed in claim 22, and further comprising an enclosure dam which surrounds the encapsulation body.

28. A composite encapsulation body as claimed in claim 22, comprising the first layer in the substantially cured, non-flowable state.

29. A composite encapsulation body as claimed in claim 22, comprising the first and second layers in a substantially solid state.

30. An encapsulation body, comprising:

a substrate;

an electronic element borne by the substrate; and a composite encapsulation layer enclosing the electronic element, the composite encapsulation layer having a discrete first material covering the electronic element, and which has an axially outer surface, and a second material in conformal overlying relation relative to the axially outer surface, and wherein, the first and second materials are both two part epoxies, having individually unique curing rates, and wherein the curing rate of the second material is greater than the curing rate of the first material.

31. An encapsulation body, comprising:

a substrate;

an electronic element borne by the substrate; and a composite encapsulation layer enclosing the electronic element the composite encapsulation layer having a discrete first material covering the electronic element; and wherein the first material is a two party epoxy, and a second material in conformal overlying relation relative to the first material, and wherein the second material is a light curable coat.

32. An encapsulation body, comprising:

a substrate;

an electronic element borne by the substrate; and a composite encapsulation layer enclosing the electronic element, the composite encapsulation layer having a discrete first material covering the electronic element, the first material having an axially outer surface, and wherein the first material is a two part epoxy, and a second material in conformal overlying relation relative to the first material, and wherein the second material accelerates the hardening of the axially outer surface to form the second material.

* * * * *

UNITED STATES PATENT AND TRADEMARK OFFICE
CERTIFICATE OF CORRECTION

PATENT NO. : 5,700,981
DATED : December 23, 1997
INVENTOR(S) : Mark E. Tuttle, et al It is certified that error appears in the above-identified patent and that said Letters Patent is hereby corrected as shown below:

Column 3, line 43, substitute the word "thermosetting" for the words "thermos erring".

Signed and Sealed this

Third Day of March, 1998

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO. : 5,700,981
DATED : December 23, 1997
INVENTOR(S) : Mark E. Tuttle et al.

It is certified that error appears in the above-identified patent and that said Letters Patent is hereby corrected as shown below:

Column 8, line 12, change the word "party" to the word "part".

Signed and Sealed this

Thirty-first Day of March, 1998

Attest:

*Attesting Officer*

BRUCE LEHMAN

*Commissioner of Patents and Trademarks*